United States Patent [19]

Yamaguchi et al.

[11] Patent Number: 4,591,801

[45] Date of Patent: May 27, 1986

[54] DIFFERENTIAL AMPLIFIER CIRCUIT

[75] Inventors: Akira Yamaguchi, Yokohama; Eiji Masuda, Kawasaki, both of Japan

[73] Assignee: Tokyo Shibaura Denki Kabushiki Kaisha, Japan

[21] Appl. No.: 559,721

[22] Filed: Dec. 9, 1983

[30] Foreign Application Priority Data

Dec. 10, 1982 [JP] Japan ................................ 57-216376

[51] Int. Cl.$^4$ ............................................. H03F 3/45
[52] U.S. Cl. ..................................... 330/261; 330/253
[58] Field of Search ................ 330/252, 253, 261, 258

[56] References Cited

U.S. PATENT DOCUMENTS

| | | | |
|---|---|---|---|
| 3,885,220 | 5/1975 | Fluegal | 330/252 |
| 4,037,170 | 7/1977 | Richards | 330/258 |
| 4,352,998 | 10/1982 | Baker et al. | 330/258 |
| 4,509,019 | 4/1985 | Banu et al. | 330/305 |

OTHER PUBLICATIONS

Design of an ADM-CODEC-LSI with Low Voltage Operation, The Institute of Electronics and Communications Engineers of Japan SSD 82-53 by Uchimura et al. May 1982.

Primary Examiner—James B. Mullins
Assistant Examiner—G. Wan
Attorney, Agent, or Firm—Finnegan, Henderson, Farabow, Garrett & Dunner

[57] ABSTRACT

Disclosed is a differential amplifier circuit in which attenuators are provided to the inverting input terminal and non-inverting input terminal of the differential amplifier, respectively, whereby the amplitudes of input voltages are attenuated so that the amplitudes may fall within a linear range of operation of the differential amplifier, and whereby the input voltages are set at an operating point of the differential amplifier.

6 Claims, 9 Drawing Figures 4,591,801

DIFFERENTIAL AMPLIFIER CIRCUIT

BACKGROUND OF THE INVENTION

The present invention relates to the improvement of the linearity characteristic of a differential amplifier with respect to an input voltage.

A differential amplifier is used in a large number of electric circuits. The symbol thereof takes such a form as illustrated in FIG. 1 by a character OP. FIG. 2 shows a circuit diagram of one example of the differential amplifier comprised of C-MOS FETs. (Complementary-Metal Oxide Semiconductor Field Effect Transistor). In this example, the MOS transistors M1, M2 and M3 are connected in series between a high level power source voltage $V_{DD}$ and a low level power source voltage $V_{SS}$, thereby constituting a constant voltage source $S_{cv}$. The MOS transistors M4 and M5 constitute constant current sources, respectively, and, a constant voltage is applied from the constant voltage source $S_{cv}$ to the gates thereof. The MOS transistors M6 and M7 constitute a differential operation circuit DOC the gates of which are applied with differential voltages, respectively. The MOS transistors M8 and M9 constitute load elements of the MOS transistors M6 and M7 of the differential operation circuit DOC, respectively. An output voltage Vout of the differential operation circuit DOC is outputted through a MOS transistor M10 constituting an output circuit. To this output circuit, a phase compensation circuit is provided, which phase compensation circuit comprises a series circuit of a capacitor C and a resistor R.

In such a prior art differential amplifier as shown in FIG. 2, however, when the input signal voltage Vin becomes approximate to a low level power source voltage $V_{SS}$, the MOS transistors M6 and M7 which constitute the differential operation circuit DOC are cut off with the result that they cease to operate. On the other hand, when the input signal voltage Vin becomes approximate to a high level power source voltage $V_{DD}$, the MOS transistors M6 and M7 disadvantageously operate in an unsaturated area. As a result, the linearity of the output signal voltage is impaired. For this reason, in a differential amplifier circuit of so-called "voltage follower connection type" wherein the output terminal is connected to the inverting input terminal (−) as in FIG. 3, the input voltage Vin−output voltage Vout characteristic curve is as graphically shown in FIG. 4. That is to say, as seen in the graphic diagram of FIG. 4, where the input voltage Vin is in the range of $V_{SS}<Vin<V_{SS}+Va$ (a range indicated in FIG. 4 by a character "$D_L$"), the MOS transistors M6 and M7 are cut off with the result that the linearity characteristic of the output voltage Vout is impaired. The voltage Va is determined by the threshold voltage of the MOS transistors M6 and M7, not depending upon the power source voltages. On the other hand, where the input voltage Vin is in the range of $V_{DD}-Vb<Vin<V_{DD}$ (a range indicated in FIG. 4 by a character "$D_H$"), the MOS transistors M6 and M7 also operate in an unsaturated area. In this case as well, the linearity characteristic of the output voltage Vout is impaired. As will be clear from the foregoing, the prior art differential amplifier had a problem in that the range of its input voltage over which the linearity of the output voltage is obtained is narrow. Further, when the high level power source voltage $V_{DD}$ is set at a low level, the linear range of operation (a range between Va and Vb indicated in FIG. 4 by a notation "$D_M$") disadvantageously becomes narrow. For this reason, a reduction in the power source voltage $V_{DD}$ has hitherto been hindered. Further, when the input voltage Vin is displaced from an operating point of the differential amplifier, the output voltage is distorted.

SUMMARY OF THE INVENTION

The present invention has been accomplished to overcome the above-mentioned circumstances and an object thereof is to provide a differential amplifier circuit which can have a linear characteristic with respect to a wide range of input voltages thereto.

Another object of the present invention is to provide a differential amplifier circuit which, even in the case of a low power source voltage, can have a linear characteristic with respect to a wide range of input voltages.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, there is provided a differential amplifier circuit comprising a differential amplifier having an inverting input terminal and a non-inverting input terminal and, first and second attenuator, which are respectively connected to said inverting input terminal and said non-inverting input terminal for receiving first and second input voltages, respectively; said first and second attenuators having the same circuit construction and designed to attenuate the amplitudes of the first and second input voltages thereto so that their amplitudes fall within a linear range of operation of said differential amplifier, and which set the input voltages at an operating point of said differential amplifier.

The accompanying drawings, which are incorporated in and constitute a part of this specification, illustrate embodiments of the invention and together with the description, serve to explain the principles of the invention.

DETAILED DESCRIPTION OF THE PREFERRED EMBODIMENT

Figure 1:
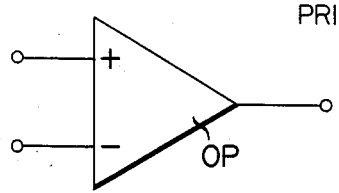
FIG. 1 is a view showing the symbol of a differential amplifier.
Figure 2:
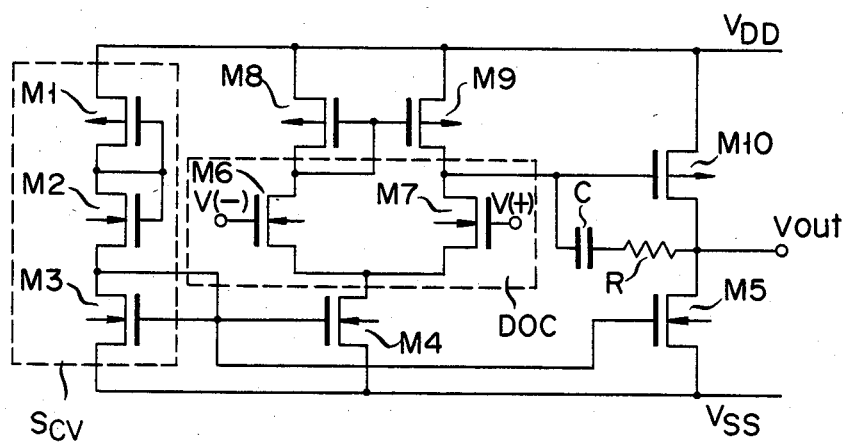
FIG. 2 is a circuit diagram showing a detailed construction of a conventional differential amplifier.
Figure 3:
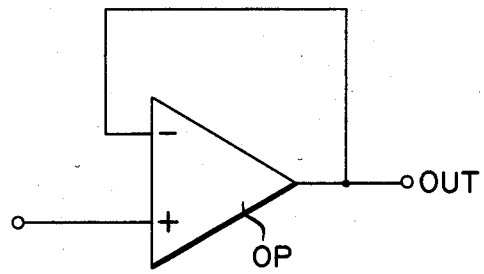
FIG. 3 is a view showing one example of the application of a differential amplifier in a voltage follower connection.
Figure 4:
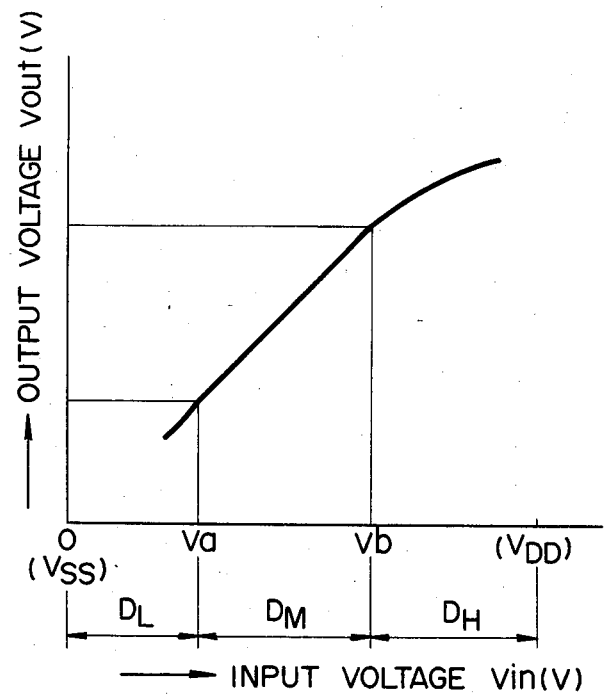
FIG. 4 is an input voltage Vin−output voltage Vout characteristic curve diagram of the differential amplifier of voltage follower connection type shown in FIG. 3.
Figure 5:
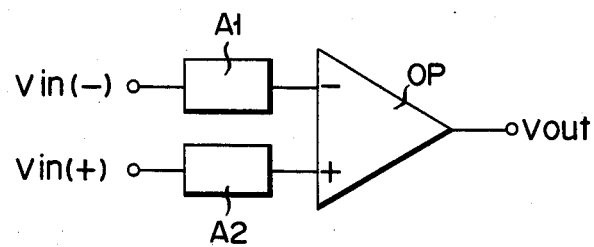
FIG. 5 is a block diagram showing a basic construction of the circuit of the present invention.

FIG. 5 is a block diagram showing a basic construction of the circuit of the present invention. Attenuators A1 and A2 are connected to an inverting input terminal (−) and non-inverting input terminal (+) of a differential amplifier OP shown in FIG. 5, respectively. The attenuators A1 and A2 are substantially of the same construction. Input voltages Vin(−), Vin(+) are inputted to the inverting and non-inverting input terminals (−) and (+) of the differential amplifier OP by the attenuators A1 and A2 where the respective input voltages have their amplitudes attenuated.

As mentioned above, according to the construction shown in FIG. 5, the input voltages Vin(−), Vin(+) are inputted to the differential amplifier OP after the input voltages have their amplitude attenuated by the attenuators A1 and A2. Accordingly, where the amplitude of the input voltages Vin(−), Vin(+) are expected to exceed a linear range of operation of the differential amplifier OP, the amplitude can be reduced to fall within the linear range of operation of the differential amplifier OP, by suitably setting the attenuation level or degree of the attenuators A1 and A2.

Figure 6:
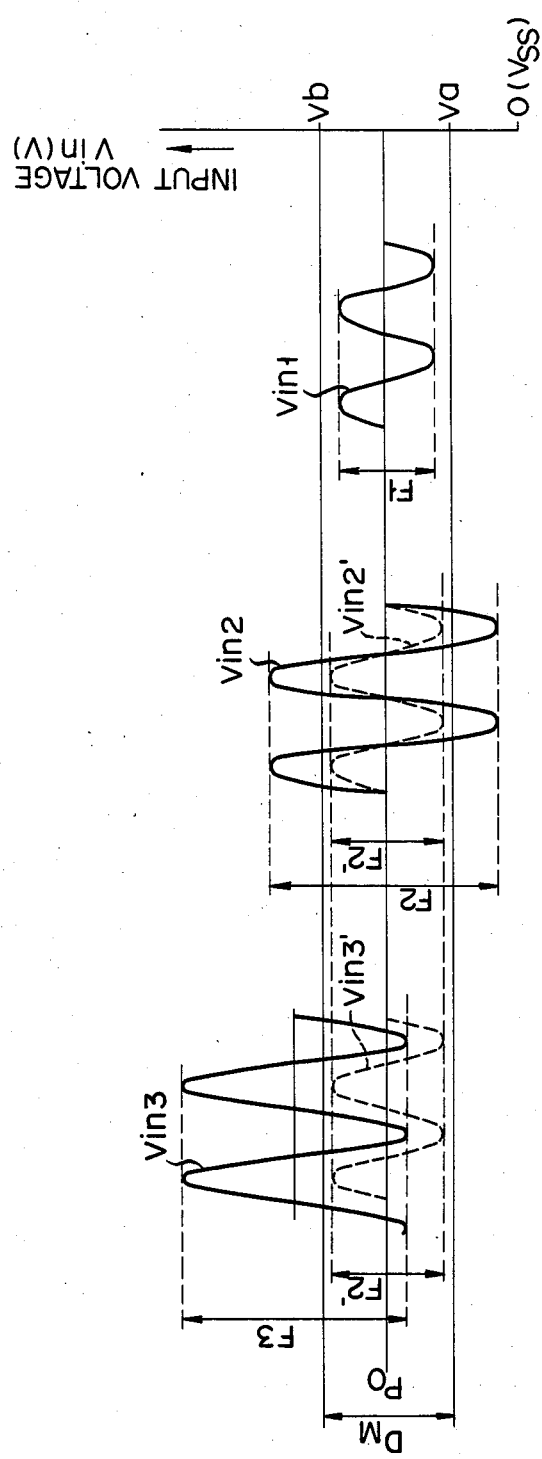
FIG. 6 shows the waveforms of input voltages where the voltages are reduced in amplitude.

Also according to the construction shown in FIG. 5, where the input voltages Vin(−), Vin(+) are shifted or displaced from an operating point of the differential amplifier OP, the input voltages Vin(−), Vin(+) can be set at the operating point by designing the attenuators A1 and A2 to take such displacement into consideration. These features will now be explained in detail with reference to FIG. 6. FIG. 6 shows the waveforms of the input voltages and the voltages reduced and/or set at an operating point of the differential amplifier. A range $D_M$ between the input voltages Va–Vb represents the linear range of operation of the differential amplifier OP. The differential amplifier OP performs its linear operation with respect to the input volage Vin1 whose amplitude F1 falls within the linear range $D_M$, so that the differential amplifier OP produces an output voltage Vout having no distortion with respect to the input voltage Vin1.

Where the input voltage has an amplitude F2 exceeding the linear range $D_M$ as indicated by a character Vin2 and when the input voltage Vin2 is applied as it is to the differential amplifier OP, the differential amplifier OP operates in a nonlinear range. As a result, the output voltage Vout has distortions with respect to the input voltage Vin2. In this embodiment, therefore, where the input voltage expected to be inputted has the amplitude F2 which exceeds the linear range $D_M$ of the differential amplifier OP as indicated by the character Vin2, the amount of attenuation of the attenuators A1 and A2 provided at the input side of the differential amplifier OP is suitably set in accordance with the amplitude F2, thereby attenuating the amplitude F2 into an amplitude F2′ which falls within the linear range $D_M$ as indicated by a character Vin2′. In this way, when the input voltage Vin2 has the amplitude F2 which exceeds the linear range $D_M$ of the differential amplifier OP, the amplitude F2 is attenuated by the attenuators A1 and A2 so that its magnitude may fall within the linear range $D_M$. As a result, it is possible to cause the differential amplifier OP to operate in the linear range $D_M$. Consequently, an output voltage Vout having no distortions is produced from the differential amplifier OP with respect to the input voltage Vin2. There will be described later as to how the attenuators A1 and A2 are designed in order to attenuate the amplitude of the input voltages.

As mentioned above, according to this embodiment, with respect to the input voltage Vin2 having the amplitude F2 exceeding the linear range $D_M$ of the differential amplifier OP the amplitude F2 is so attenuated as to have its magnitude fall within the linear range $D_M$, and it is, therefore, possible for the differential amplifier OP to maintain its linearity with respect to the input voltage having a wide range of amplitudes, even in the low power source voltage.

Further where the input voltage is displaced from the operating point $P_o$ of the differential amplifier OP and has an amplitude F3 which exceeds the linear range $D_M$ as indicated by a character Vin3 and when the input voltage Vin3 is applied as it is to the differential amplifier OP, the differential amplifier OP operates in a nonlinear range. As a result, the output voltage Vout has distortions with respect to the input voltage Vin3. In this embodiment, therefore, where the input voltage expected to be inputted is displaced from the operating point $P_o$ of the differential amplifier OP and has the amplitude F3 exceeding the linear range $D_M$ of the differential amplifier OP as indicated by the character Vin3, the attenuators A1 and A2 provided at the input side of the differential amplifier OP are suitably designed in accordance with the displacement and amplitude F3, of the input voltage thereby attenuating the amplitude F3 into an amplitude F2′ falling within the linear range $D_M$ and setting the input voltage at the operating point $P_o$ as indicated by a character Vin3′.

In this way, when the input voltage Vin3 is displaced from the operating point $P_o$ and has the amplitude F3 which exceeds the linear range $D_M$ of the differential amplifier OP, the input voltage Vin3 is set at the operating point and has the amplitude F2′ falling within the linear range $D_M$, by suitably setting the attenuators A1 and A2. As a result, it is possible to cause the differential amplifier OP to operate in the linear range $D_M$. Consequently, an output voltage Vout having no distortions is produced from the differential amplifier OP with respect to the input voltage Vin3. There will be described later as to how the attenuators A1 and A2 are designed in order to attenuate the amplitude of the input voltage and set the input voltage at the operating point $P_o$.

Figure 7:
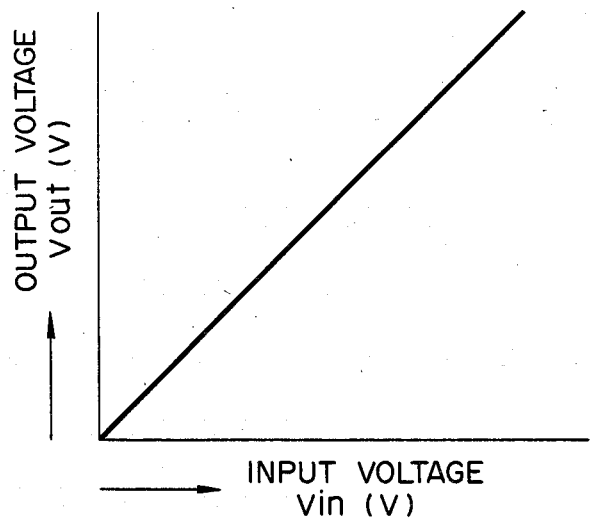
FIG. 7 shows an input voltage-output voltage characteristic curve of the differential amplifier circuit of the present invention shown in FIG. 5 where the differential amplifier circuit has a voltage follower connection.

Accordingly, where the differential amplifier circuit shown in FIG. 5 is the voltage follower connection type, it is possible for the differential amplifier circuit of the present invention to have a linear characteristic with respect to a wide range of input voltage. In FIG. 7, where the input voltage Vin is plotted on the abscissa and the output voltage Vout on the ordinate, such linearity is demonstrated.

Figure 8:
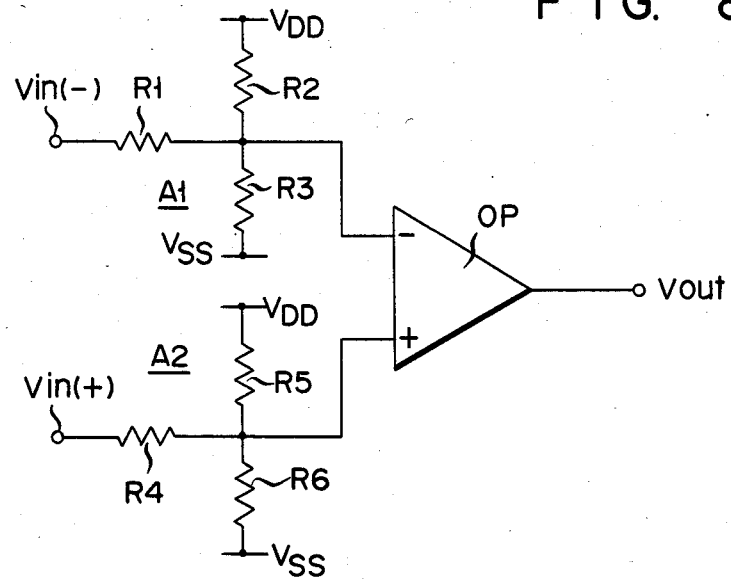
FIG. 8 shows the differential amplifier circuit of the present invention shown in FIG. 5 wherein the detailed construction of the attenuators are illustrated.

FIG. 8 shows a detailed construction of the attenuators A1 and A2 of the circuit shown in FIG. 5. In the circuit having the construction shown in FIG. 8, two attenuators A1 and A2 are substantially of the same construction. The attenuator A1 provided at the inverting input terminal (−) side of the differential amplifier OP is comprised of a first resistor R1 having one end applied with the input voltage Vin(−) and the other end connected to the inverting input terminal (−), a second resistor R2 having one end connected to the high level power surce $V_{DD}$ and the other end connected to said other end of the first resistor R1, and a third resistor R3 having one end connected to the low level power source $V_{SS}$ and the other end connected to said other end of the first resistor R1.

The attenuator A2 provided at the non-inverting input terminal (+) side of the differential amplifier OP has substantially the same construction as the attenuator A1 and, therefore, description thereof is omitted. Its resistors correspond to the resistors R1, R2 and R3, only they are designated by R4, R5 and R6. Note that the resistor R1 of the attenuator A1 is applied at one end with the input voltage Vin(−) and is connected at the other end with the inverting input terminal (−). On the other hand, the resistor R4 corresponding to the resistor R1 is applied at one end with the input voltage Vin(+) and is connected at the other end with the non-inverting input terminal (+).

In the attenuators A1 and A2 having the above-mentioned construction, it is possible to set their attenuation level or degree as desired and to set input voltages Vin(−), Vin(+) at the operating point $P_o$ of the differential amplifier OP, by suitably determining the resistance of each resistor R1-R6. The resistances of the resistor R1-R6 are determined in accordance with the expected amplitude range of the input voltages Vin(−), Vin(+), the expected displacement of the input voltage Vin from the operating point of the differential amplifier, the values of the power source voltages $V_{DD}$ and $V_{SS}$, the linear range $D_M$ of the differential amplifier OP, etc.

There will now be described as to how the attenuator is designed in order to set the degree of amplitude change at a desired value and set the input signal at the operating point of the differential amplifier with reference to FIG. 8. The characters R1, R2 and R3 are correspondingly used for the resistance of the resistor R1, R2 and R3, respectively, for easy understanding.

When the parallel resistances of the resistors R1 and R2, R1 and R3, and R2 and R3 are denoted by R3', R2' and R1', respectively, the parallel resistances R3', R2' and R1' are given by the following relations, respectively:

$$\frac{1}{\frac{1}{R1} + \frac{1}{R2}} = R3'$$

$$\frac{1}{\frac{1}{R1} + \frac{1}{R3}} = R2'$$

$$\frac{1}{\frac{1}{R2} + \frac{1}{R3}} = R1'$$

The voltage V(−) applied to the inverting input terminal (−) is given by $$V(-) = \frac{R3'}{R3' + R3} V_{SS} + \frac{R2'}{R2' + R2} V_{DD} + \frac{R1'}{R1' + R1} V_{in}(-).$$

The amplitude is determined by $$\left(\frac{R1'}{R1' + R1}\right).$$

When the amplitude of the input voltage Vin(−) exceeds the linear range $D_M$ of the differential amplifier OP, the resistances of the resistors R1, R2 and R3 are selected such that $$\left(\frac{R1'}{R1' + R1}\right)$$

has a small value.

When the input voltage is over the operating point $P_o$ of the differential amplifier OP, the resistances R1, R2 and R3 are selected such that $$\left(\frac{R2'}{R2' + R2}\right)$$

is made smaller than $$\left(\frac{R3'}{R3' + R3}\right).$$

Contrary to this, when the input voltage is below the operating point $P_o$, the resistances R1, R2 and R3 are selected such that $$\left(\frac{R2'}{R2' + R2}\right)$$

is made larger than $$\left(\frac{R3'}{R3' + R3}\right).$$

The input voltage is at the operating point $P_o$, the resistances R2 and R3 are selected to have an equal value.

The attenuator A2 has substantially the same construction as the attenuator A1 and, therefore, description thereof is omitted. However, substantially the same thing described above can be applied to the attenuator A2.

Figure 9:
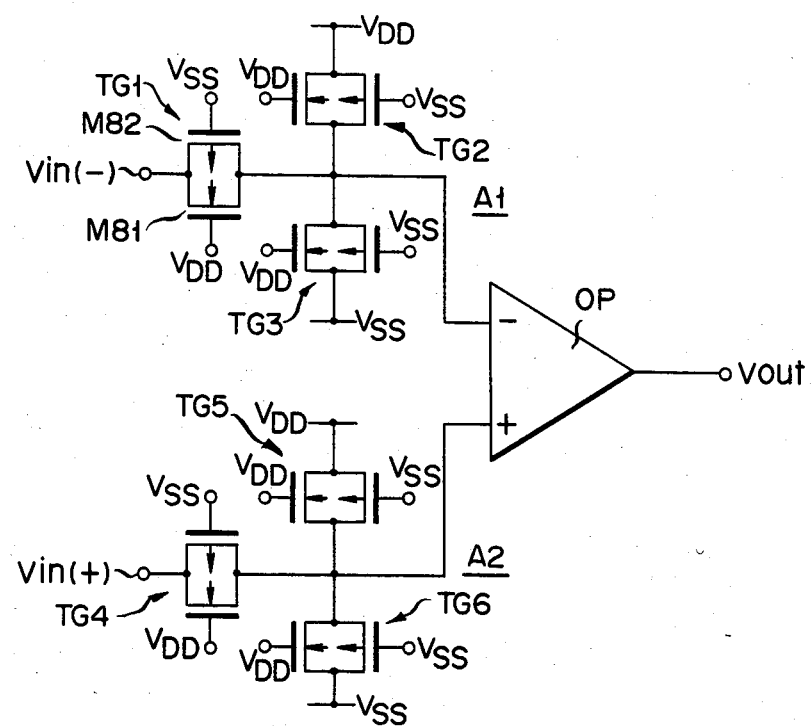
FIG. 9 shows the differential amplifier circuit of the present invention shown in FIG. 5 wherein the detailed construction of another embodiment of the attenuators is illustrated.

FIG. 9 shows another detailed construction of the attenuators A1 and A2 of the circuit shown in FIG. 5. In this circuit shown in FIG. 9, the attenuators A1 and A2 are constituted by the transfer gates TG1 to TG6 comprising MOS transistors corresponding to the resistors R1 to R6, whereas in the circuit shown in FIG. 8 the attenuators A1 and A2 are constituted by the resistors R1 to R6. That is to say, each resistor R1 to R6 involved in the circuit of FIG. 8 is replaced, in the circuit of FIG. 9, by the transfer gate TG1 to TG6 comprising an N channel MOS transistor M81 and a P channel MOS transistor M82 connected in parallel thereto. The gate of the N channel MOS transistor M81 is supplied with the high level power source $V_{DD}$. The gate of the P channel MOS transistor M82 is supplied with the low level power source voltage $V_{SS}$. The respective junctions of the N channel MOS transistor M81 and P channel MOS transistor M82 of each transfer gate TG1, TG2, TG3, TG4, TG5 or TG6 correspond to the two ends of the corresponding resistor contained in the circuit of FIG. 8

Since the circuit shown in FIG. 9 is substantially the same as the circuit shown in FIG. 8 excepting that the transfer gates TG1 to TG6 are substituted for the resistors R1 to R6 involved in the circuit of FIG. 8, respectively, any further description thereof is omitted. In the circuit of FIG. 9 as well, it is possible to set the attenuation degree as desired by suitably determining the resistance value of each transfer gate TG1 to TG6. The resistances of the transfer gates TG1 to TG6 are selected as the same manner as the resistances R1 to R6 in FIG. 8 circuit.

As described above, according to the present invention, it is possible to provide a differential amplifier circuit which has a linear characteristic with respect to a wide range of amplitude of input voltages and enables a reduction in voltage of the power soruce.

What is claimed is:

1. A differential amplifier circuit comprising:
    a differential amplifier having an inverting input terminal and a non-inverting input terminal; and
    first and second attenuators which are respectively connected to said inverting input terminal and said non-inverting input terminal, means for applying first and second circuit input voltages to said inverting input terminal and said non-inverting input terminal through said first and second attenuators, respectively;
    said first and second attenuators having the same circuit construction and designed to attenuate the amplitudes of the first and second input voltages so that their amplitudes fall within a linear range of operation of said differential amplifier, and to set the input voltages at an operating point of said differential amplifier.

2. A differential amplifier circuit according to claim 1, wherein said first and second attenuators are each comprised of a plurality of resistor elements.

3. A differential amplifier circuit according to claim 1, wherein said first attenuator is comprised of a first resistor element to which is applied at one end the first input voltage and which is connected at the other end to said inverting input terminal of said amplifier, a second resistor element which is connected at one end with a first power source voltage and which is connected at the other end with said other end of said first resistor element, and a third resistor element which is connected at one end with a second power source voltage and which is connected at the other end to said other end of said first resistor element, and said second attenuator is comprised of a fourth resistor element to which is applied at one end the second input voltage and which is connected at the other end to said non-inverting input terminal of said amplifier, a fifth resistor element which is connected at one end with a first power source voltage and which is connected at the other end with said other end of said fourth resistor element, and a sixth resistor element which is connected at one end with a second power source voltage and which is connected at the other end to said other end of said fourth resistor element.

4. A differential amplifier circuit according to claim 1, wherein said first and second attenuators are each comprised of a plurality of transfer gates each comprising a MOS FET.

5. A differential amplifier circuit according to claim 1, wherein said first attenuator is comprised of a first transfer gate to which is applied at one end the first input voltage and which is connected at the other end to said inverting input terminal of said amplifier, a second transfer gate which is connected at one end with a first power source voltage and which is connected at the other end to said other end of said first transfer gate, and a third transfer gate which is connected at one end with a second power source voltage and which is connected at the other end to said other end of said first transfer gate, and said second attenuator is comprised of a fourth transfer gate to which is applied at one end the second input voltage and which is connected at the other end to said non-inverting input terminal of said amplifier, a fifth transfer gate which is connected at one end with a first power source voltage and which is connected at the other end to said other end of said fourth transfer gate, and a sixth transfer gate which is connected at one end with a second power source voltage and which is connected at the other end to said other end of said fourth transfer gate.

6. A differential amplifier circuit according to claim 5, wherein said first to sixth transfer gates each comprise an N channel MOS transistor and a P channel MOS transistor connected in parallel thereto, said N and P channel MOS transistors having gates connected to said first power source voltage and said second power source voltage, respectively.

* * * * *